(12) United States Patent
Nakaya et al.

(10) Patent No.: US 7,239,563 B2
(45) Date of Patent: Jul. 3, 2007

(54) SEMICONDUCTOR DEVICE FOR OUTPUTTING DATA READ FROM A READ ONLY STORAGE DEVICE

(75) Inventors: Shuji Nakaya, Kobe (JP); Mitsuaki Hayashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 423 days.

(21) Appl. No.: 10/728,497

(22) Filed: Dec. 5, 2003

(65) Prior Publication Data

US 2004/0140488 A1 Jul. 22, 2004

(30) Foreign Application Priority Data

Dec. 10, 2002 (JP) ............................. 2002-358586

(51) Int. Cl.
*G06F 12/16* (2006.01)
*G11C 8/12* (2006.01)
*G11C 29/00* (2006.01)

(52) U.S. Cl. .......................... 365/200; 711/5; 711/102; 365/230.03

(58) Field of Classification Search .................... 711/1, 711/102, 159, 5; 365/200, 230.03
See application file for complete search history.

(56) References Cited

U.S. PATENT DOCUMENTS 5,452,258 A 9/1995 Hotta 5,467,457 A 11/1995 Kohda et al.

FOREIGN PATENT DOCUMENTS

| JP | 63-213200 | 9/1988 |
|----|-----------|--------|
| JP | 64-38852 | 2/1989 |
| WO | WO 01/20454 A1 | 3/2001 |

*Primary Examiner*—Jack A. Lane
(74) *Attorney, Agent, or Firm*—Akin Gump Strauss Hauer & Feld LLP

(57) ABSTRACT

A semiconductor device for outputting data read from a read only storage device, includes a plurality of read only storage devices, each including memory cells, a plurality of selecting signal lines for transmitting selecting signals to the read only storage devices for indicating a read only storage device storing data to be read, an address signal line for transmitting an address signal to the read only storage devices for indicating an address of memory cells storing data to be read and a switching device. The switching device has an address storage circuit for storing address information of a defective memory cell and detecting whether or not selected memory cells include a defective memory cell, a data storage circuit for storing replacement data for memory cells including a defective memory cell, and a switching circuit. The switching circuit inputs data from memory cells of a selected read only storage device and replacement data and outputs the data from the memory cells of the selected read only storage device and replacement data instead of data from the selected read only storage device which is stored in memory cells including a defective memory cell.

3 Claims, 14 Drawing Sheets

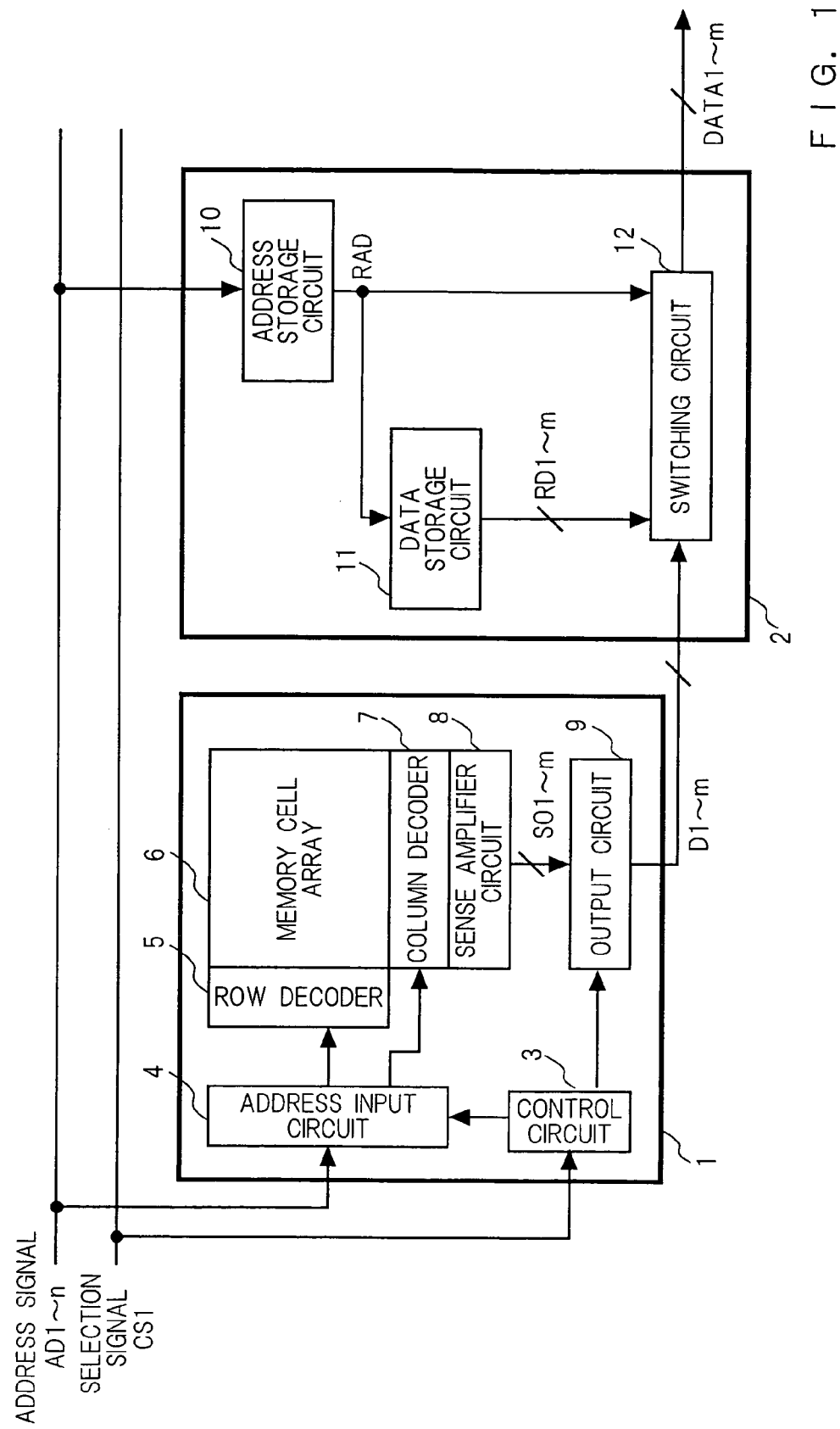
F I G. 1

SEMICONDUCTOR DEVICE FOR OUTPUTTING DATA READ FROM A READ ONLY STORAGE DEVICE

BACKGROUND OF THE INVENTION

The present invention relates to a read only storage device installed in semiconductor devices, particularly to a mask ROM (read only memory) into which information is written at the manufacturing stage.

Recently, in a mask ROM, as the manufacturing process gets finer and the storage capacity increases, it has become an important issue to improve the production yield. In order to improve the production yield, the technique for replacing a defective memory cell with a spare memory cell is proposed. A specific description will be provided below with reference to the drawings.

FIG. 13 is a circuit diagram showing a configuration of a prior art semiconductor device. The semiconductor device in FIG. 13 comprises a control circuit 3, an address input circuit 4, a row decoder 5, a memory cell array 6, a column decoder 7, a sense amplifier circuit 8, an output circuit 9, an address storage circuit 10, a data storage circuit 11, and a switching circuit 20 which inputs the data from the memory cell array 6 and the data from the data storage circuit 11, selects either of these two pieces of data based on the output information from the address storage circuit 10 and outputs the selected data.

FIG. 2 shows a configuration example of the address storage circuit 10. The address storage circuit 10 stores the address of a memory cell to be replaced (a defective memory cell) in the memory cell array 6. In FIG. 2, the address storage circuit 10 inputs address signals AD1–ADn. The address signals AD1–ADn connect to the gate terminals of transistors TRP1–TRPn and the inputs of inverters 201–20n. The outputs of the inverters 201–20n connect to the gate terminals of transistors TRN1–TRNn. The source of each of the transistors TRP1–TRPn and TRN1–TRNn is grounded and the drain thereof is connected via the corresponding one of fuse elements FAP1–n and FAN1–n to the input of two serially connected inverters 221–222. An output signal (control signal) RAD from these two serially connected inverters 221–222 is transmitted to the data storage circuit 11 and the switching circuit 20.

When there is a defective memory cell, in the manufacturing step, the fuse elements of the address storage circuit 10 in FIG. 2 are disconnected by laser in response to the values of the address signals AD1–ADn of the defective memory cell. Namely, if the address signal ADi of the defective memory cell (i: an arbitrary integer of 1 through n) is 1 (high level), the fuse element FAPi is disconnected, whereas, if the address signal ADi of the defective memory cell is 0 (low level), the fuse element FANi is disconnected. Afterwards, when the address signals AD1–ADn coincide with the address of the defective memory cell, the control signal RAD is driven high, whereas, when the address signals AD1–ADn constitute the address of other than the defective memory cell, the control signal RAD is driven low.

FIG. 3 shows a configuration example of the data storage circuit 11. The data storage circuit 11 stores m-bit data of the memory cell to be replaced (defective memory cell) in the memory cell array 6. The data storage circuit 11 inputs the control signal RAD from the address storage circuit 10, which is further input to the gate terminals of transistors TRD1–TRDm. The source of each transistor is grounded, and the drain thereof is connected via the corresponding one of fuse elements FD1–m to the input of each of two-stage inverters 301–30m. Output data RD1–m from the two-stage inverters 301–30m is transmitted to the switching circuit 20.

When there is a defective memory cell, the m-bit data which should have been stored in the memory cell is stored in m circuit(s) of the data storage circuit 11. Specifically, in the manufacturing step, the address signals AD1–ADn of the defective memory cell are input to the address storage circuit 10 and the control signal RAD is driven high. The data storage circuit 11 inputs the high control signal RAD. The transistors TRD1–TRDm of the data storage circuit 11 are all brought into conduction.

When data DATAj (j: an arbitrary integer of 1 through m) is high in response to m-bit data DATA1–DATAm which should have been stored in the defective memory cell, the fuse element FDj of the bit is disconnected by laser. If the DATAj is 0 (low level), the fuse element FDj is not disconnected. As a result, when the control signal RAD is driven high (if the address signals AD1–ADn of the defective memory cell are input to the semiconductor device), the data storage circuit 11 outputs the m-bit data of the defective memory cell.

FIG. 14 shows a configuration example of the switching circuit 20 of the prior art semiconductor device. M selection circuits 1401–140m of the switching circuit 20 input output data SO1–SOm coming via the sense amplifier from the memory cell array 6 and the output data RD1–RDm coming from the data storage circuit 11 (each of these two pieces of the output data comprises m bits), select either the output data SO1–SOm or RD1–RDm according to the control signal RAD output from the address storage circuit 10 and output the selected data as data DI1–m. When the control signal RAD is high, the switching circuit 20 outputs the data RD1–m, whereas, when the control signal RAD is low, the switching circuit 20 outputs the data SO1–m.

As described above, when there is a defective memory cell in the memory cell array 6, the address of the defective memory cell is stored by disconnecting the corresponding fuses among the fuses FAP1–n and FAN1–n of the address storage circuit 10. The data of the defective memory cell is stored by disconnecting the corresponding fuses among the fuses FD1–m of the data storage circuit 11. When the address input signals AD1–n coincide with the address of the defective memory cell, the control signal RAD output from the address storage circuit 10 is driven high, whereby the switching circuit 20 outputs the data coming from the data storage circuit 11, and from the output circuit 9, the data coming from the data storage circuit 11 is output. When the address signals AD1–n don't coincide with the address of the defective memory cell, the control signal RAD output from the address storage circuit 10 is driven low, whereby the switching circuit 20 outputs the data coming from the memory cell array 6. The output circuit 9 outputs the data coming from the memory cell array 6 according to a selection signal CS1 (storage device selection information) (if the mask ROM core is selected by the selection signal CS1).

In recent years, semiconductor devices, with increasing sophistication, have come with a plurality of mask ROM cores (referred to as a storage device) which are of high-speed reading type and of low capacity. The prior art semiconductor device had the switching circuit 20 between the sense amplifier circuit 8 of the mask ROM core and the output circuit 9. The transmission delay time from when the address storage circuit 10 inputs the address signals AD1–n until the data read from the data storage circuit 11 arrives at the switching circuit 20 is longer than the transmission delay time from when the address circuit 4 inputs the address signals AD1–n until the data read from the memory cell array 6 of high-speed reading type arrives at the switching circuit 20. Therefore, the prior art semiconductor device has a problem that the data read time in the case of replacing the defective memory cell with the address storage circuit 10 and the data storage circuit 11 gets longer than the usual data read time.

In general, fuse elements constitute a very large chip area. Since the prior art semiconductor device has a configuration where the address storage circuit and the data storage circuit for replacing the data of the defective memory cell are provided per ROM core (a configuration where the switching from the data of the defective memory cell to the replacement data is performed in each mask ROM core), there is a problem that the chip area of the semiconductor device having a plurality of mask ROM cores increases.

The present invention intends to solve the above-mentioned problem and is intended to provide a semiconductor device wherein the data read time in the case of replacing the defective memory cell with the address storage circuit and the data storage circuit is equal to the data read time in the case of reading data from the memory cell array.

The present invention further intends to provide a semiconductor device which has a configuration where a plurality of mask ROM cores share the address storage circuit and the data storage circuit so that two or more mask ROM cores are provided while the chip area is small.

BRIEF SUMMARY OF THE INVENTION

In order to attain the above-mentioned objects, a semiconductor device of the present invention has a configuration where the switching from the data of a defective memory cell to the replacement data is performed on an output data line of a storage device including a mask ROM core. The semiconductor device of the present invention further has a configuration where a plurality of mask ROM cores share an address storage circuit and a data storage circuit.

A semiconductor device in accordance with one aspect of the present invention has a read only storage device which outputs data read from a memory cell in response to storage device selection information and address information, and a switching device wherein the switching device comprises: an address storage circuit for storing the address information of a defective memory cell of the read only storage device; a data storage circuit for storing the replacement data of the defective memory cell; and a switching circuit which inputs the output data from the read only storage device and the output data from the data storage circuit, and outputs either of these two pieces of output data based on the address information stored in the address storage circuit.

The semiconductor device which has a configuration where the replacement of the data of the defective memory cell is carried out on the output data line of the read only storage device so that the data read time in the case of replacing the defective memory cell with the address storage circuit and the data storage circuit is equal to the data read time in the case of reading data from the memory cell array can be obtained.

A semiconductor device in accordance with another aspect of the present invention has a plurality of read only storage devices which share an output data line and output data read from a memory cell in response to storage device selection information and address information, and a switching device wherein the switching device comprises an address storage circuit for storing the storage device selection information and the address information of a defective memory cell of at least one of the read only storage devices, a data storage circuit for storing the replacement data of the defective memory cell, and a switching circuit which inputs the output data output from the read only storage device via the output data line and the output data from the data storage circuit, and outputs either of these two pieces of output data based on the storage device selection information and the address information stored in the address storage circuit.

According to the configuration of the present invention, in addition to the effect in the semiconductor device described above, two or more read only storage devices having the output data line in common can share the address storage circuit and the data storage circuit, whereby the increase of the area of the address storage circuit and the data storage circuit is curbed while the replacement of the data of the defective memory cell in two or more read only storage devices is permitted.

A semiconductor device in accordance with another aspect of the present invention has a plurality of read only storage devices, each of which includes a separate output data line and outputs data read from a memory cell in response to storage device selection information and address information, and a switching device wherein the switching device comprises: an address storage circuit for storing the storage device selection information and the address information of a defective memory cell of at least one of the read only storage devices; a data storage circuit for storing the replacement data of the defective memory cell; and a plurality of switching circuits individually placed at each of the output data line, which input the output data output from the read only storage device via the output data line and the output data from the data storage circuit, and output either of these two pieces of output data based on the storage device selection information and the address information stored in the address storage circuit.

According to the configuration of the present invention, in addition to the effect in the semiconductor device described above, two or more read only storage devices each having a different output data line can share the address storage circuit and the data storage circuit, the increase of the area of the address storage circuit and the data storage circuit is curbed while the replacement of the data of the defective memory cell in two or more read only storage devices is permitted.

The above-mentioned semiconductor device in accordance with still another aspect of the invention is a device wherein, instead of the data storage circuit, a bit storage circuit for storing bit information of a defective bit of the defective memory cell, or the bit storage circuit for storing bit information of a defective bit and a data storage circuit for storing the replacement data of the defective bit are provided; and the switching circuit inputs the output data from the read only storage device, and an inversed signal of the output data from the read only storage device or the output data from the data storage circuit or fixed data of 0 or 1, selects either of them based further on the bit information and outputs the selection by the bit.

According to the configuration of the preset invention, since the replacement data is stored by the bit, the area of the data storage circuit can further be reduced.

A semiconductor device in accordance with still another aspect of the present invention has a rewritable storage device which is provided with redundancy memory cells and outputs data read from its memory cell array in response to storage device selection information and address information, a read only storage device which outputs data read from its memory cell array in response to the storage device selection information and the address information, and a switching device wherein the switching device comprises an address storage circuit for storing the storage device selection information and the address information of a defective memory cell of the rewritable storage device, and the storage device selection information and the address information of a defective memory cell of the read only storage device; a data storage circuit for storing the replacement data of the defective memory cell of the read only storage device; and a switching circuit which inputs the output data from the read only storage device and the output data from the data storage circuit, and outputs either of these two pieces of output data based on the storage device selection information and the address information stored in the address storage circuit; and the rewritable storage device outputs either the output data read from the usual memory cell array or the output data read from the redundancy memory cell based on the storage device selection information and the address information stored in the address storage circuit.

According to the configuration of the present invention, in addition to the effect in the semiconductor device described above, the read only storage device and the rewritable storage device can share the address storage circuit, whereby the increase of the area of the address storage circuit is curbed while the replacement of the data of the defective memory cell in the read only storage device and the rewritable storage device is permitted.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF DRAWINGS

FIG. 1 is a block diagram showing a configuration of a semiconductor device in accordance with Embodiment 1 of the present invention.

Figure 2:
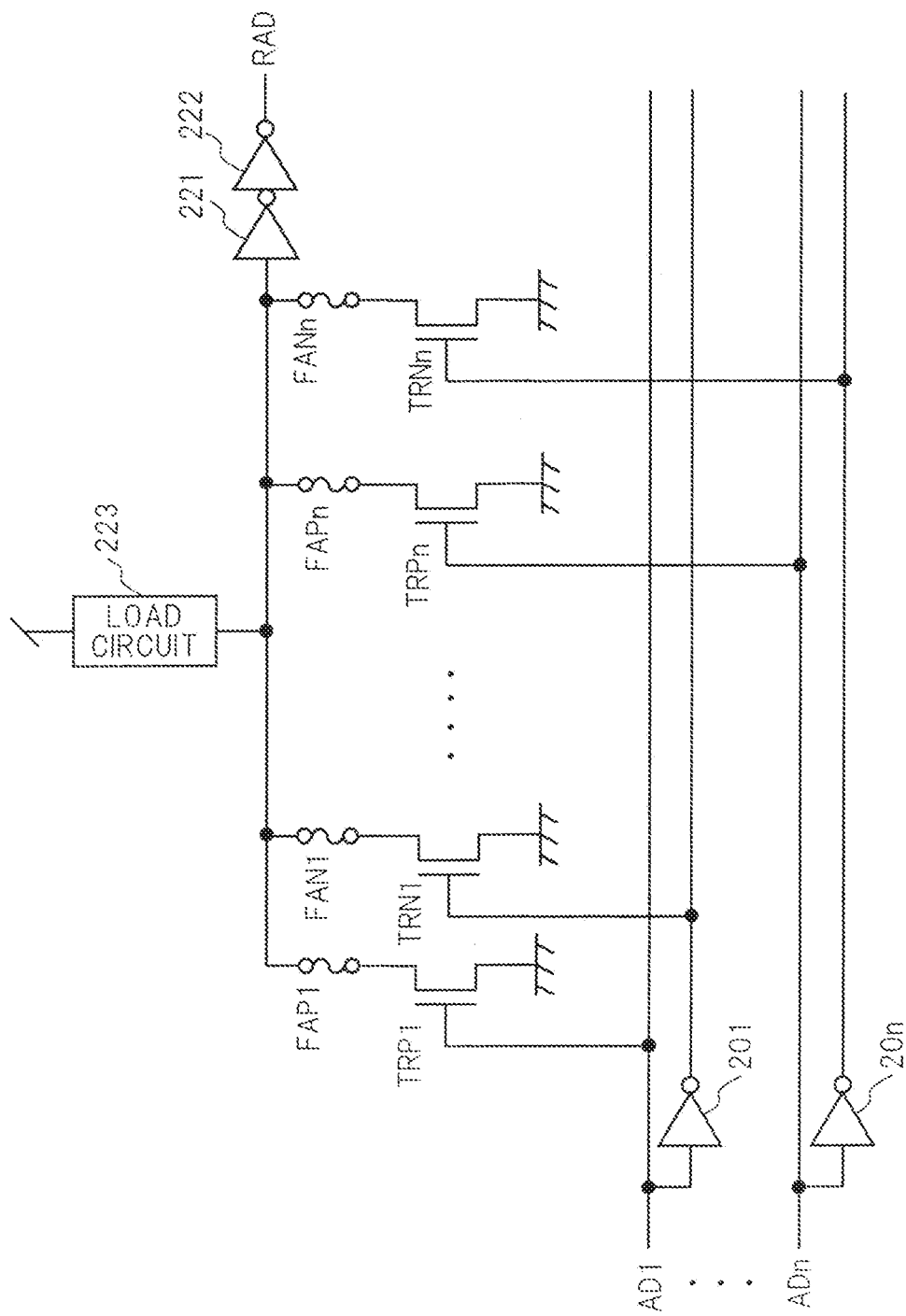
FIG. 2 is a circuit diagram of an address storage circuit in accordance with a prior art example and Embodiment 1 of the present invention.
Figure 3:
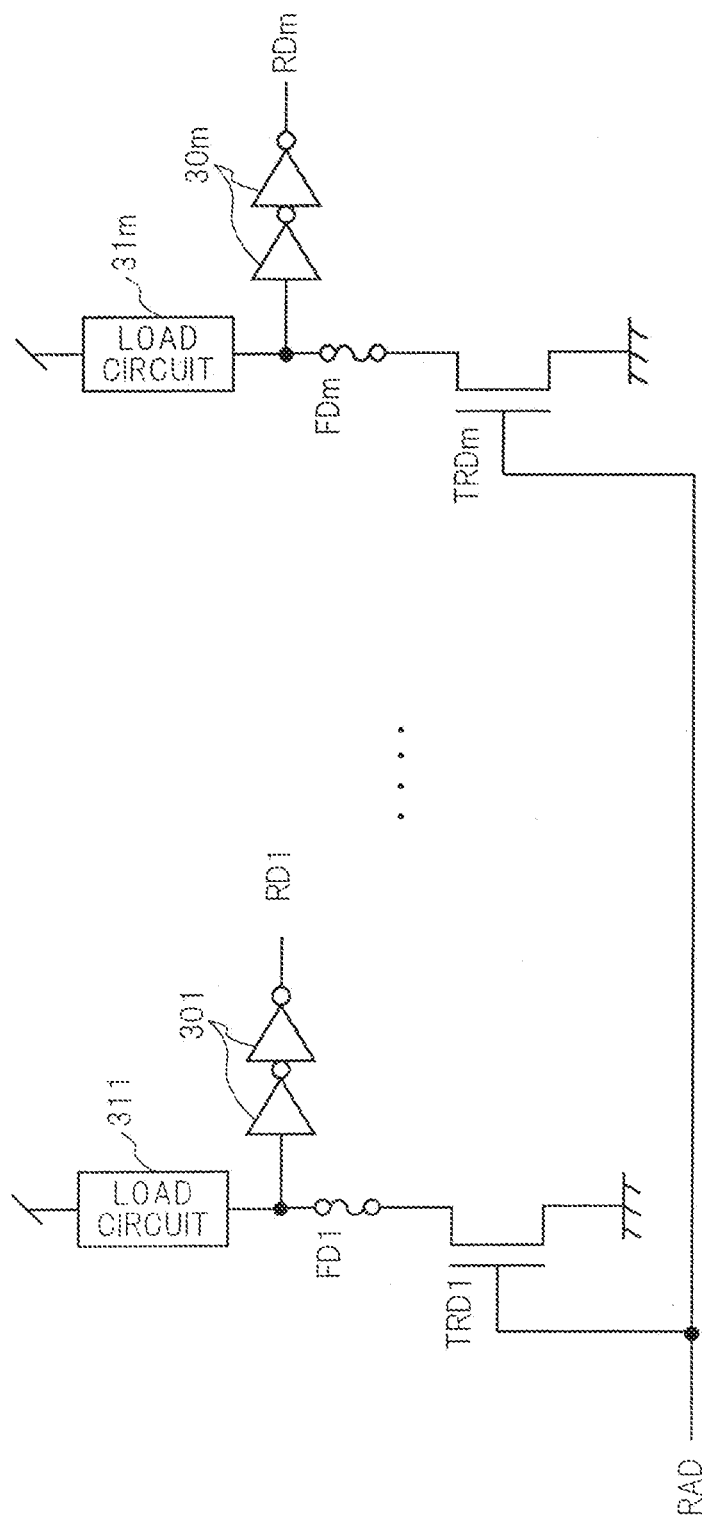
FIG. 3 is a circuit diagram of a data storage circuit in accordance with the prior art example and Embodiments 1, 3–5 of the present invention.

It will be recognized that some or all of the Figures are schematic representations for purposes of illustration and do not necessarily depict the actual relative sizes or locations of the elements shown.

DETAILED DESCRIPTION OF THE INVENTION

Embodiments specifically showing the best mode for carrying out the present invention will be described below with reference to the drawings.

<<EMBODIMENT 1>>

FIG. 1 is a circuit diagram showing a configuration of a semiconductor device in accordance with Embodiment 1 of the present invention. The semiconductor device shown in FIG. 1 has a mask ROM core (storage device) 1 and a switching device 2 for replacing the data of a defective memory cell. The mask ROM core (storage device) 1 has a control circuit 3, an address input circuit 4, a row decoder 5, a memory cell array 6, a column decoder 7, a sense amplifier circuit 8, and an output circuit 9. The switching device 2 has an address storage circuit 10 for storing the address of the memory cell to be replaced (defective memory cell) in the memory cell array 6, and a data storage circuit 11 for storing data of the memory cell to be replaced in the memory cell array 6.

Figure 4:
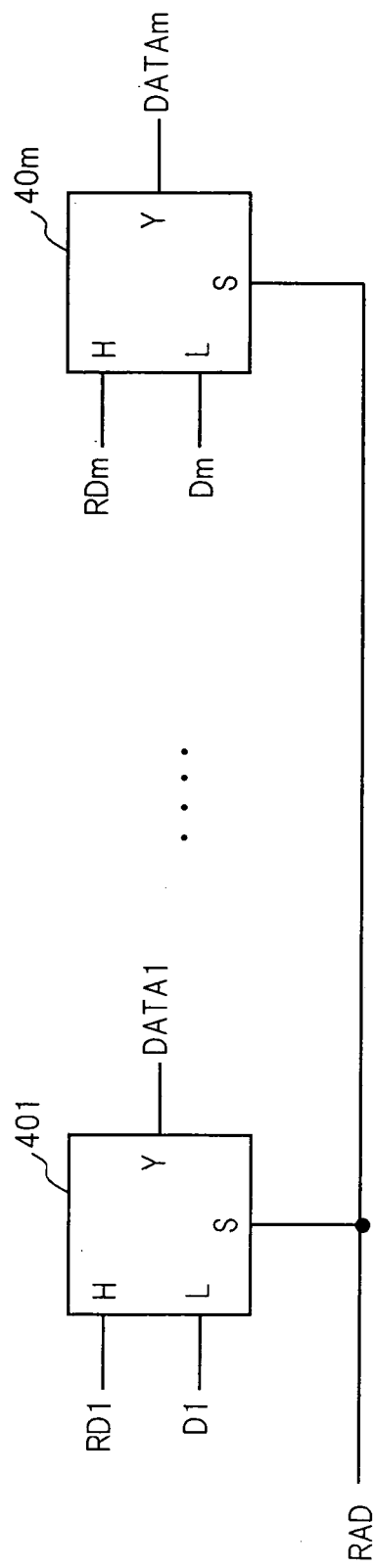
FIG. 4 is a circuit diagram of a switching circuit in accordance with Embodiments 1, 3–5 of the present invention.

The control circuit 3, the address input circuit 4, the row decoder 5, the memory cell array 6, the column decoder 7, the sense amplifier circuit 8, the output circuit 9, the address storage circuit 10 and the data storage circuit 11 are the same as in the prior art semiconductor device. The same numerals are applied to the same components, so that the explanation thereof is omitted. FIG. 4 shows a configuration of a switching circuit 12 of the semiconductor device in accordance with Embodiment 1. Selection circuits 401–40m of the switching circuit 12 input output data (output data from the mask ROM core 1) D1–m which the output circuit 9 outputs according to a storage device selection signal CS1 and output data RD1–m from the data storage circuit 11, select either the output data D1–m or RD1–m according to a control signal RAD output from the address storage circuit 10 and output the selected data. When the control signal RAD is high, the selection circuits 401–40m of the switching circuit 12 output the output data RD1–m. When the control signal RAD is low, the selection circuits 401–40m output the output data D1–m.

The data read operation of the semiconductor device configured as mentioned above will be described. When there is a defective memory cell in the memory cell array 6, by disconnecting the corresponding fuses among fuses FAP1–n and FAN1–n of the address storage circuit 10, the address of the defective memory cell is stored. Furthermore, the data of the defective memory cell is stored by disconnecting the corresponding fuses among fuses FD1–m of the data storage circuit 11. When address input signals AD1–n coincide with the address of the defective memory cell, the control signal RAD output from the address storage circuit 10 is driven high, and the switching circuit 12 outputs the data RD1–m coming from the data storage circuit 11, which is thus transmitted to the next circuit. When the address signals AD1–n don't coincide with the address of the defective memory cell, the control signal RAD output from the address storage circuit 10 is driven low, the switching circuit 12 outputs the data D1–m from the mask ROM core, which is thus transmitted to the next circuit.

Figure 13:
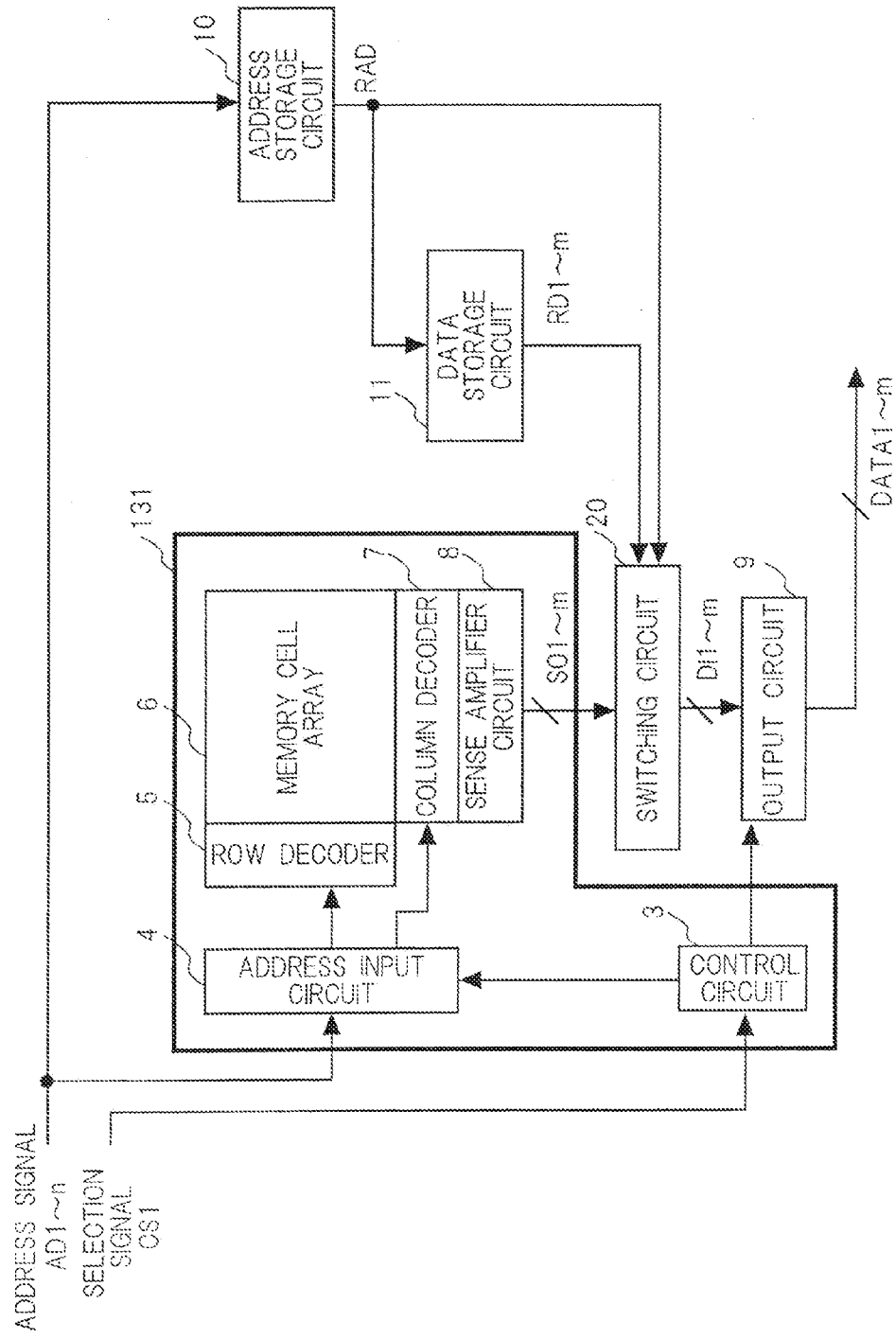
FIG. 13 is a block diagram showing a configuration of a semiconductor device in accordance with the prior art example.
Figure 14:
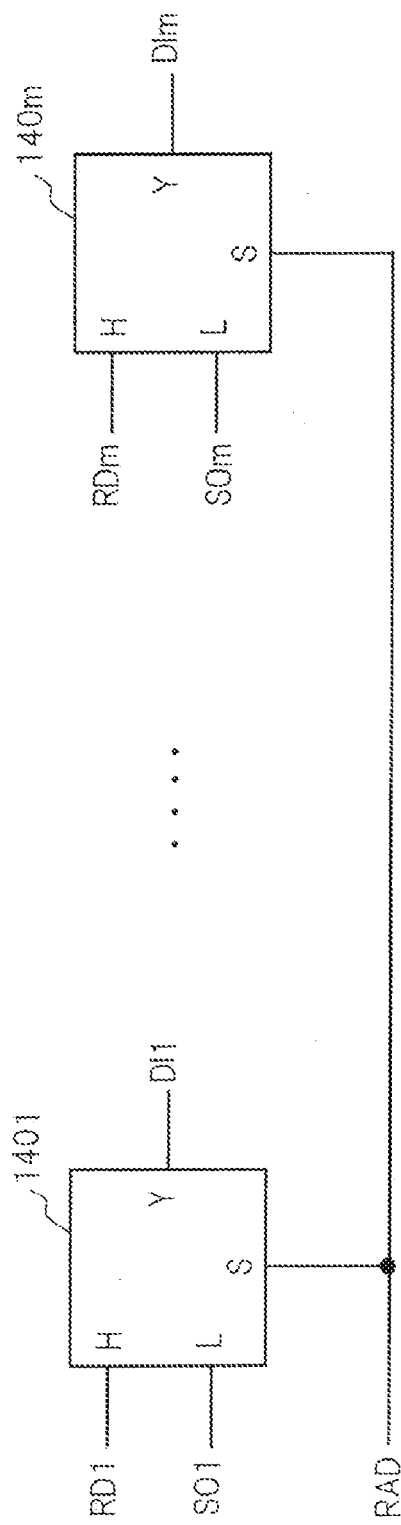
FIG. 14 is a circuit diagram of a switching circuit of the semiconductor device in accordance with the prior art example.

In the prior art semiconductor device (FIG. 13), the output circuit 9 is placed after the switching circuit 12. In the configuration of the present invention (FIG. 1), between the memory cell array 6 and the switching circuit 12, placed is the output circuit 9 controlled according to the storage device selection signal CS1. The transmission delay time until the data read from the memory cell array 6 arrives at the switching circuit 12 is longer by the transmission delay time in the output circuit 9. As a result, the transmission delay time from when the semiconductor device inputs the address signal AD1–n until the data read from the memory cell array 6 arrives at the switching circuit 12 and the transmission delay time from when the semiconductor device inputs the address signals AD1–n until the data read from the address storage circuit 10 and the data storage circuit 11 arrives at the switching circuit 12 become almost the same.

According to Embodiment 1, the semiconductor device which has a configuration where the replacement of the data of the defective memory cell is carried out on an output data line of a read only storage device so that the data read time in the case of replacing the defective memory cell with the address storage circuit and the data storage circuit is equal to the data read time in the case of reading data from the memory cell array can be obtained.

<<Embodiment 2>>

Figure 5:
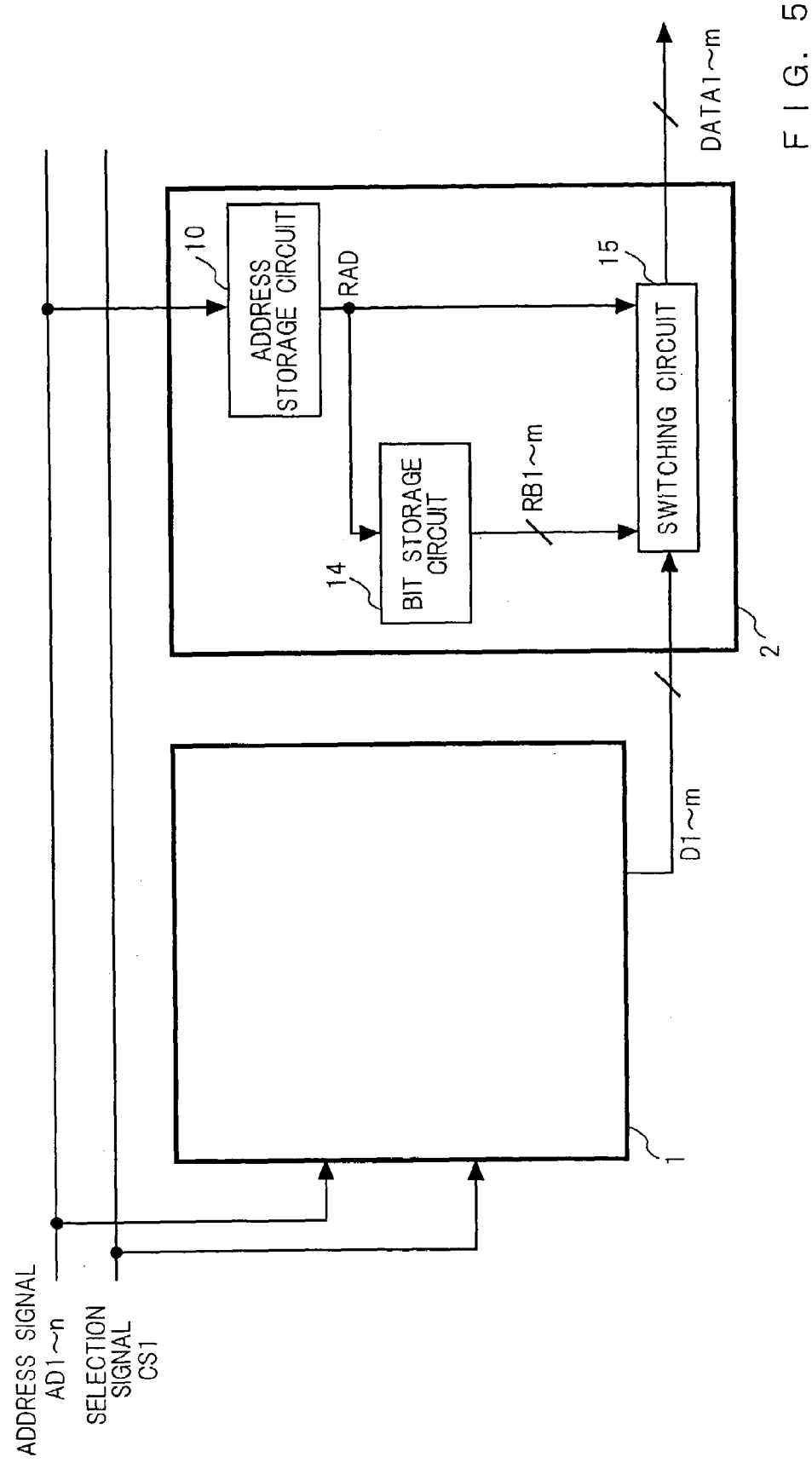
FIG. 5 is a block diagram showing a configuration of a semiconductor device in accordance with Embodiment 2 of the present invention.

FIG. 5 is a circuit diagram showing a configuration of a semiconductor device in accordance with Embodiment 2 of the present invention. The semiconductor device shown in FIG. 5 has the mask ROM core (storage device) 1 and the switching device 2 for replacing the data of a defective memory cell. The mask ROM core 1 in accordance with Embodiment 2 is the same as in Embodiment 1. The switching device 2 has the address storage circuit 10 for storing the address of the memory cell to be replaced in the mask ROM core 1, a bit storage circuit 14 for storing defective bit information of the memory cell to be replaced (defective memory cell) in the mask ROM core 1, and a switching circuit 15. The configuration of the address storage circuit 10 is the same as in the prior art semiconductor device (shown in FIG. 2). The same numerals are applied to the same components, so that the description thereof is omitted.

Figure 6:
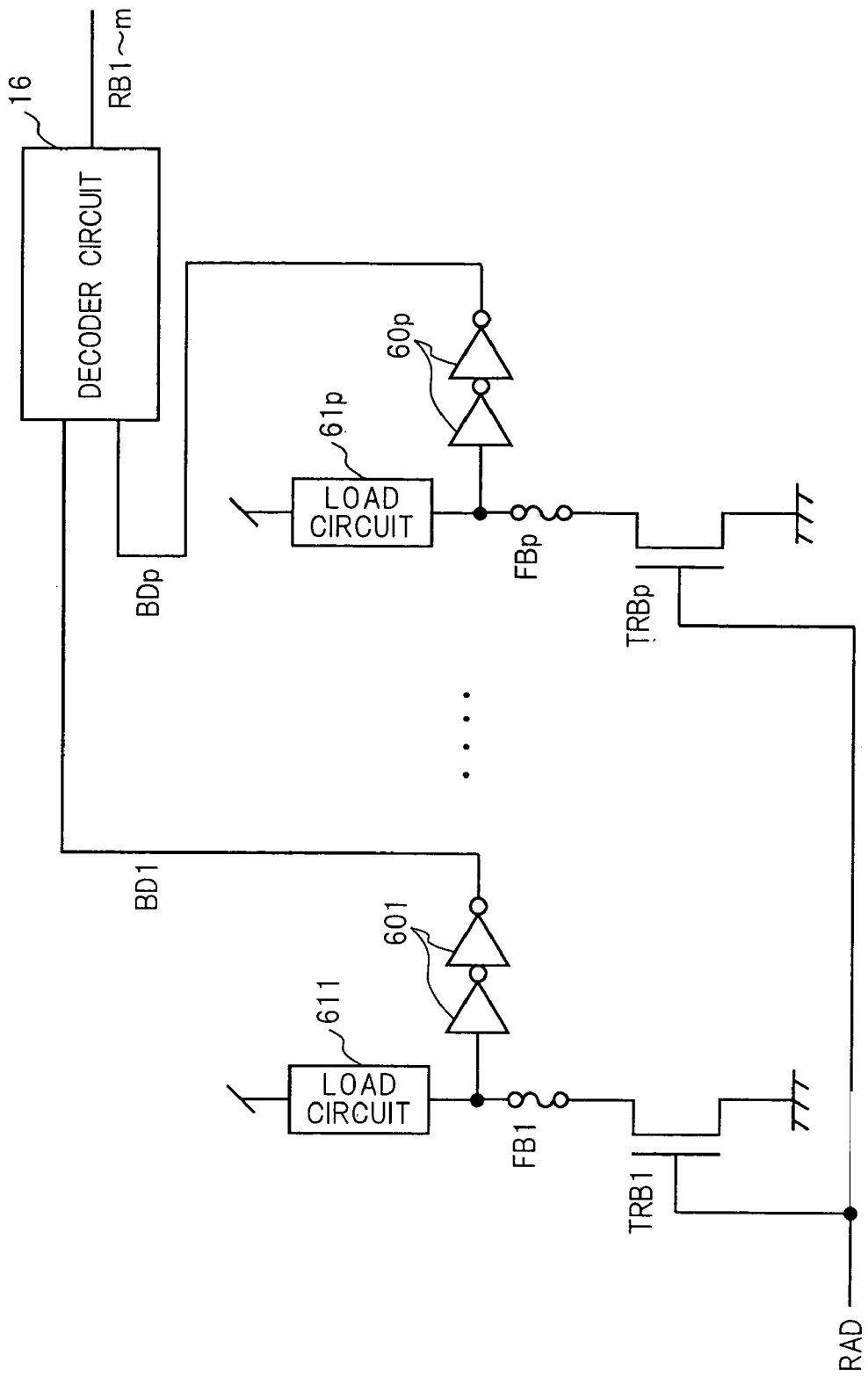
FIG. 6 is a circuit diagram of a bit storage circuit in accordance with Embodiment 2 of the present invention.

FIG. 6 is a circuit diagram showing a configuration of the bit storage circuit 14 in accordance with Embodiment 2. The bit storage circuit 14 is a circuit for storing defective bit information of the memory cell to be replaced. The bit storage circuit 14 inputs the control signal RAD output from the address storage circuit. The control signal RAD is input to the gate terminals of transistors TRB1–TRBp. The relationship between p and m is expressed by the equation, $2^P = m$. The source of each of the transistors is grounded, while the drain thereof is connected via the corresponding one of fuse elements FB1–FBp to the input of each of two-stage invertors 601–60p. Output signals BD1–p from, respectively, the two-stage invertors 601–60p are input to a decoder circuit 16.

For example, when m=8(bit), p=3. The case where a bit 5 (101B: B represents a binary number) is defective will be described by example. In the manufacturing step, the address of the defective memory cell (memory cell including the defective bit) is input to the semiconductor device.

The control signal RAD is driven high, whereby the transistors TRB1–TRBp of the bit storage circuit 14 are all brought into conduction. In the manufacturing step, the corresponding fuse element is disconnected in response to the data indicating the defective bit (defective bit information). When the data indicating the defective bit is high, the fuse element FBk of the bit is disconnected by laser. When the data indicating the defective bit is 0 (low level), the fuse element FBk is not disconnected. As a result, when the control signal RAD is driven high (if the address signals AD1–ADn of the defective memory cell are input to the semiconductor device), the transistors TRB1–TRBp output signals BD1–p (defective bit information e.g. 101B) which constitute p bits and indicate the defective bit.

The decoder circuit 16 decodes the output signals BD1–p to output the signals RB1–m. According to a combination of the signals BD1–p, one of the signals RB1–m is driven high, while the other signals are driven low. For example, if the output signals BD1–p is 101B, only the signal RB6 is driven high, while the other signals (RB1–5, RB7–8) are driven low. The signals RB1–m are transmitted to the switching circuit 15.

Figure 7:
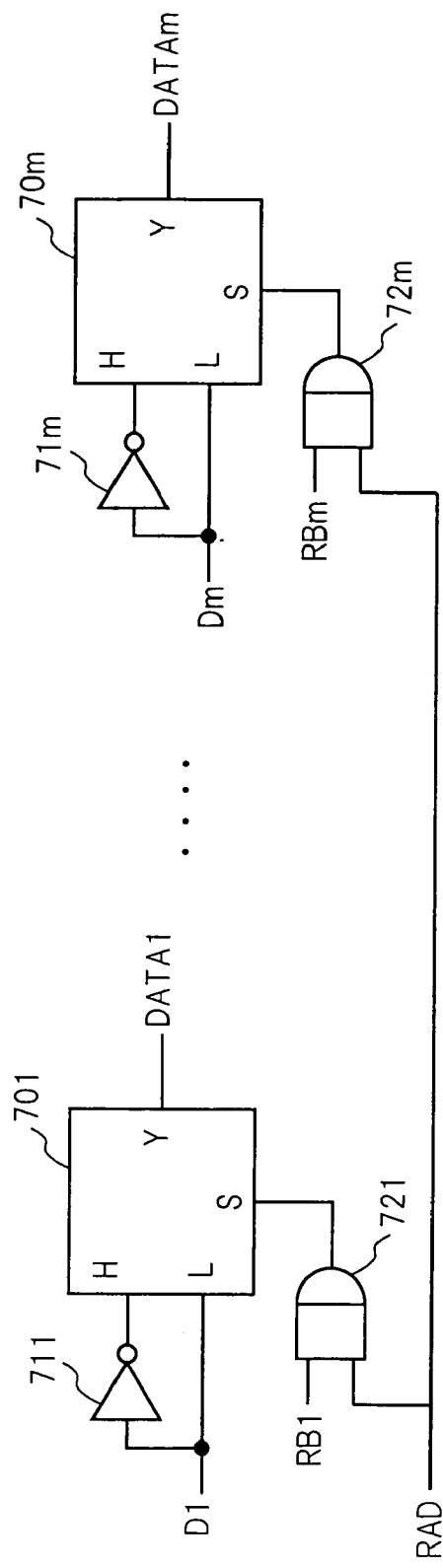
FIG. 7 is a circuit diagram of a switching circuit in accordance with Embodiment 2 of the present invention.

FIG. 7 is a circuit diagram showing a configuration of the switching circuit 15 in accordance with Embodiment 2. Selection circuits 701–70m of the switching circuit 15 input the output data D1–m coming from the mask ROM core and are controlled by the control signal RAD output from the address storage circuit 10 and the signals RB1–m output from the bit storage circuit 14 to output either the output data D1–m or the inverted signals of the output data D1–m. In the case where the control signal RAD is high, if the signal RBj (j: an integer of 1 through m) is low, the selection circuit 70j of the switching circuit 15 outputs the output data Dj. If the signal RBj is high, the selection circuit 70j outputs the inverted signal of the data Dj. When the control signal RAD is low, the switching circuit 15 outputs the output data D1–m regardless of the states of the signals RB1–m.

Defective memory cells in the mask ROM, in most cases, result from Via formation defect. When the defective memory cell results from the Via formation defect, the data to fail is fixed at a certain value (of 0 or 1, which is determined by the circuit configuration), not in a floating state. Therefore, in the configuration in accordance with FIG. 7, by providing inverted circuits, the output data from the defective memory cell can be rescued. The configuration in accordance with FIG. 7 permits a reduction in circuit size and the number of fuses.

The data read operation of the semiconductor device configured as mentioned above will be described. When there is a defective memory cell in the mask ROM core 1, by disconnecting the corresponding fuses among the fuses FAP1–n and FAN1–n of the address storage circuit 10, the address of the defective memory cell is stored. In addition, by disconnecting the corresponding fuses among the fuses FB1–p of the bit storage circuit 14, the output bit of the defective memory cell is stored. When the address input signals AD1–n coincide with the address of the defective memory cell, the control signal RAD output from the address storage circuit 10 is driven high, whereby one signal among the output signals RB1–m from the bit storage circuit 14 stored by the fuses FB1–p is driven high. With regard to the bit of the signals RB1–m which is driven high, the switching circuit 15 outputs the inversed signal of the corresponding data of the output data D1–m coming from the mask ROM core 1, while with regard to the bits of the signals RB1–m which are driven low, the switching circuit 15 outputs the corresponding data of the output data D1–m coming from the mask ROM core 1 as they are. When the address signals AD1–n don't coincide with the address of the defective memory cell, the control signal RAD output from the address storage circuit 10 is driven low, whereby the switching circuit 15 outputs the output data D1–m coming from the mask ROM core 1 as they are.

According to Embodiment 2, as with Embodiment 1, the semiconductor device which has the configuration where the replacement of the data of the defective memory cell is performed on the output data line of a read only storage device so that the data read time in the case of replacing the defective memory cell is equal to the data read time in the case of reading data from the memory cell array can be obtained.

In addition, by storing and decoding the defective bit information in the bit storage circuit to output the result thereby obtained, the circuits (fuses) for storing the data associated with the defective memory cell can be reduced in number in comparison with Embodiment 1, whereby the semiconductor device where the chip area is small can be obtained.

Instead of the configuration in accordance with Embodiment 2, the bit storage circuit 14 may further store the 1-bit data which should have been stored in the defective bit in addition to the defective bit information showing which bit is defective.

As still another method, the semiconductor device may be configured so that fixed data of 0 or 1 is input to H input terminals of the selection circuits 701–70m of the switching circuit 15 in FIG. 7 and the selection circuits 701–70m output either the output data D1–m or the fixed data.

<<Embodiment 3>>

Figure 8:
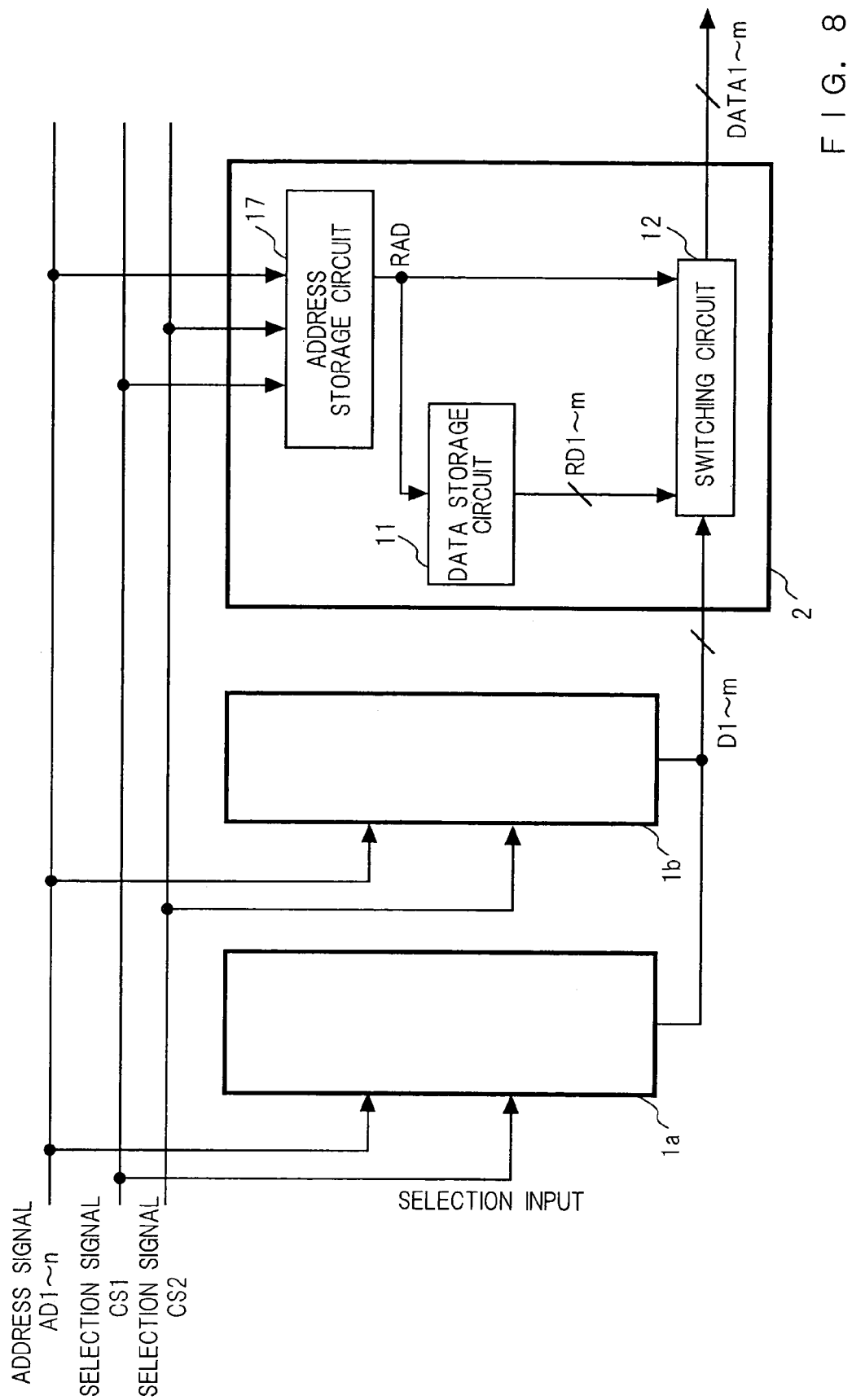
FIG. 8 is a block diagram showing a configuration of a semiconductor device in accordance with Embodiment 3 of the present invention.

FIG. 8 is a circuit diagram showing a configuration of a semiconductor device in accordance with Embodiment 3 of the present invention. The semiconductor device shown in FIG. 8 has a plurality of mask ROM cores 1a and 1b (storage devices) sharing an output signal line and the switching device 2 for replacing the data of a defective memory cell. The configuration of the mask ROM cores 1a and 1b is the same as that of the mask ROM core in accordance with Embodiment 1. The switching device 2 comprises an address storage circuit 17, the data storage circuit 11 for storing m-bit data which should have been stored in the defective memory cell, and the switching circuit 12 which inputs the output data D1–m from the mask ROM core 1 and the output data RD1–m from the data storage circuit 11, selects either the output data D1–m or RD1–m according to the control signal RAD output from the address storage circuit 10, and outputs the selected data. The data storage circuit 11 and the switching circuit 12 are the same as in accordance with Embodiment 1. The same numerals are applied to the same components, so that the description thereof is omitted.

Figure 9:
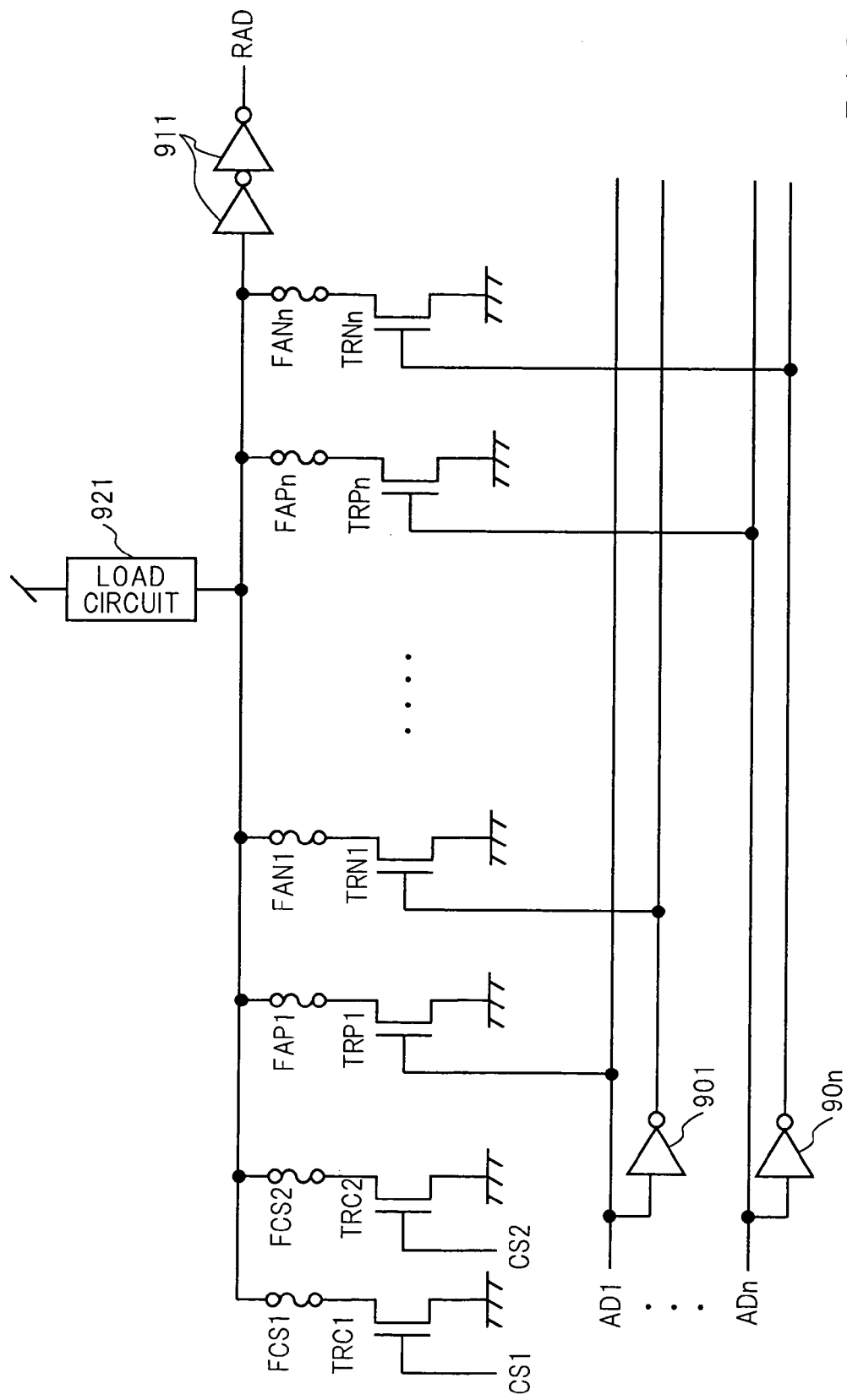
FIG. 9 is a circuit diagram of an address storage circuit in accordance with Embodiment 3 of the present invention.

FIG. 9 is a circuit diagram showing a configuration of the address storage circuit 17 of the semiconductor device in accordance with Embodiment 3. The address storage circuit 17 stores the selection signal (storage device selection information) of the mask ROM core (storage device) including the defective memory cell and the address of the memory cell to be replaced (defective memory cell) in the mask ROM core. The address storage circuit 17 inputs the selection signals CS1–2 and the address signals AD1–ADn. The selection signals CS1–2 are input to the gate terminals of transistors TRC1–2, while the address signals AD1–ADn are input to the gate terminals of transistors TRP1–n and the inputs of inverters 901–90n. The output signals from the inverters 901–90n are input to the gate terminals of the transistors TRN1–n. The source of each transistor is grounded, while the drain thereof is connected via the corresponding fuse elements among FCS1–2, FAP1–n and FAN1–n to a two-stage inverter 911. The control signal RAD output from the two-stage inverter 911 is transmitted to the data storage circuit 11 and the switching circuit 12.

The data read operation of the semiconductor device configured as mentioned above will be described. When there is a defective memory cell in the mask ROM core 1 to which the selection signal CS1 is connected, the selection signal (storage device selection information) of the mask ROM core (storage device) including the defective memory cell and the address of the defective memory cell are input to the address storage circuit 17. By the similar method to that in the description of the address storage circuit 10, the fuse FCS1 of the address storage circuit 17 and the corresponding fuses among the fuses FAP1–n, and FAN1–n are disconnected. Thus, the address storage circuit 17 stores the selection signal (storage device selection information) of the mask ROM core (storage device) including the defective memory cell and the address of the defective memory cell. The data which should have been stored in the defective memory cell is stored by disconnecting the corresponding fuses among the fuses FD1–m of the data storage circuit 11.

When the selection signal CS1 is selected and the address input signals AD1–n coincide with the address of the defective memory cell, the control signal RAD output from the address storage circuit 17 is driven high, whereby the switching circuit 12 outputs the data RD1–m coming from the data storage circuit 11, which is further transmitted the next circuit. When the selection signal CS2 is selected, or when the selection signal CS1 is selected and the address signals AD1–n don't coincide with the address of the defective memory cell, the control signal RAD output from the address storage circuit 10 is driven low, whereby the switching circuit 12 outputs the data D1–m from the mask ROM core 1, which is further transmitted to the next circuit.

According to Embodiment 3, as with Embodiment 1, the semiconductor device which has the configuration where the replacement of the data of the defective memory cell is performed on the output data line of the read only storage device so that the data read time in the case of replacing the defective memory cell is equal to the data read time in the case of reading data from the memory cell array can be obtained. By virtue of the configuration where two mask ROM cores having the output data line in common share the address storage circuit and the data storage circuit, the increase in chip area of the semiconductor device is curbed while the replacement of the data of the defective memory cell in two mask ROM cores is permitted.

According to Embodiment 3, the signal from the address storage circuit and the data from the data storage circuit carry out replacement of the defective memory cell. Instead of this, as with Embodiment 2, the signal from the address storage circuit and the signal from the bit storage circuit may replace the data of the defective memory cell by the bit. As a result, the similar effect to that in Embodiment 2 can be obtained.

In Embodiment 3, two mask ROM cores having the output data line in common was described. It is possible to increase the signal CS and apply the present invention to three mask ROM cores or more sharing the same output data line. In this case, the effect of curbing the area increase is enhanced.

<<Embodiment 4>>

Figure 10:
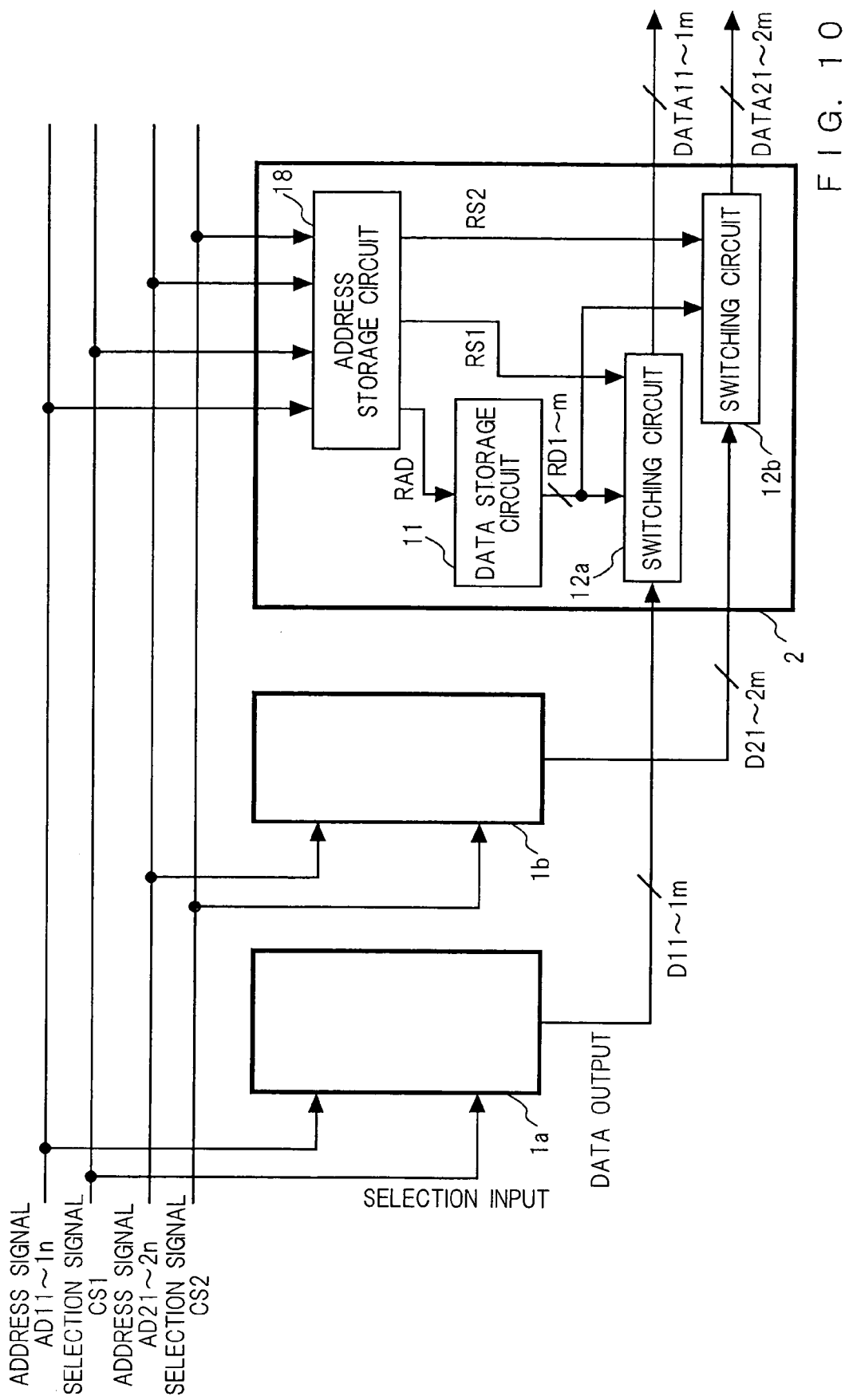
FIG. 10 is a block diagram showing a configuration of a semiconductor device in accordance with Embodiment 4 of the present invention.

FIG. 10 is a circuit diagram showing a configuration of a semiconductor device in accordance with Embodiment 4 of the present invention. The semiconductor device shown in FIG. 10 comprises a plurality of mask ROM cores (storage device) 1a and 1b each having a separate output signal line, and the switching device 2 for replacing the data of a defective memory cell. The configuration of the mask ROM cores 1a and 1b is the same as that of the mask ROM core 1 in accordance with Embodiment 1. The switching device 2 has an address storage circuit 18, the data storage circuit 11 for storing m-bit data which should have been stored in the defective memory cell, a switching circuit 12a which inputs the output data D11–D1m from the mask ROM core 1a and the output data RD1–m from the data storage circuit 11, selects either the output data D11–D1m or RD1–m according to a control signal RS1 output from the address storage circuit 10 and outputs the selected output data, and a switching circuits 12b which inputs the output data D21–D2m from the mask ROM core 1b and the output data RD1–m from the data storage circuit 11, selects either the output data D21–2m or RD1–m according to a control signal RS2 output from the address storage circuit 10 and outputs the selected output data. The data storage circuit 11, and the switching circuits 12a and 12b in accordance with Embodiment 4 have the same configurations as those of, respectively, the data storage circuit 11 and the switching circuit 12 in accordance with Embodiment 1. The description of the components similar to those in Embodiment 1 is omitted.

Figure 11:
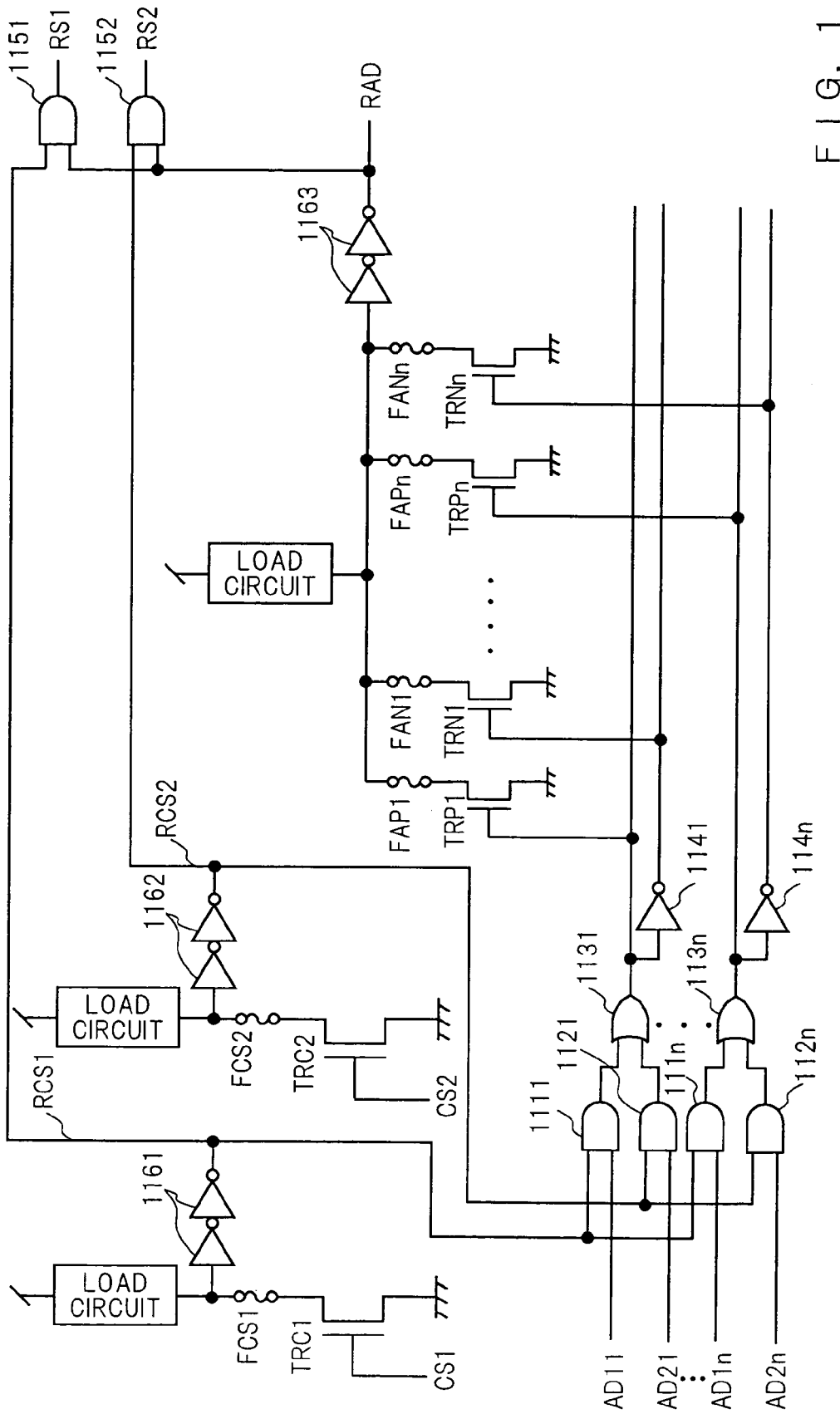
FIG. 11 is a circuit diagram of an address storage circuit in accordance with Embodiment 4 of the present invention.

FIG. 11 is a circuit diagram showing a configuration of the address storage circuit 18 of the semiconductor device in accordance with Embodiment 4. The address storage circuit 18 stores the selection signal (storage device selection information) from the mask ROM core (storage device) including the defective memory cell and the address of the memory cell to be replaced (defective memory cell) in the mask ROM core. The address storage circuit 18 inputs the selection signals CS1–2, the address signals AD11–AD1n and the AD21–AD2n. The selection signals CS1–2 are connected to the gate terminals of transistors TRC1–2. The source of each of the transistor TRC1–2 is grounded, while the drain thereof is connected via the corresponding fuse element FCS1 or 2 to the input of two-stage inverter 1161 or 1162. The two-stage inverters output the output signals RCS1–2. When there is a defective memory cell, in the manufacturing step, by the similar method to that in the description of FIG. 2, the fuse FCS1 or FCS2 associated with the mask ROM core (storage device) including the defective memory cell is disconnected. For example, if the mask ROM core (storage device) 1a has a defective memory cell, the fuse FCS 1 is disconnected. AS a result, the selection signal (e.g. CS1) associated with the mask ROM core (storage device) including the defective memory cell is driven high, while the other selection signal (e.g. CS2) is driven low.

AND gates 1111–111n input the output signal RCS1 and addresses AD11–1n. AND gates 1121–112n input the output signal RCS2 and addresses AD21–2n. OR gates 1131–113n input the output signals from the AND gates 1111–1111n and the output signals from the AND gates 1121–112n. When the selection signal (storage device selection information) CS1 or 2 of the mask ROM core (storage device) including the defective memory cell is input to the semiconductor device, the OR gates 1131–113n output the address signals AD1–AD1n or AD21–AD2n of the mask ROM core.

The outputs of the OR gate 1131–113n are connected to the gate terminals of the transistors TRP1–TRPn and the inputs of inverters 1141–114n. The outputs of the inverters 1141–114n are connected to the gate terminals of the transistors TRN1–TRNn. The source of each of the transistors TRP1–TRPn and TRN1–TRNn is grounded, while the drain thereof is connected via the corresponding one of fuse elements FAP1–n and FAN1–n to the input of one two-stage inverter 1163. The output signal (control signal) RAD from the two-stage inverter 1163 is transmitted to the data storage circuit 11 and the switching circuits 12a and 12b.

When there is a defective memory cell, in the manufacturing step, by the similar method to that in the description of FIG. 2, the corresponding fuses among the fuses FAP1–n and FAN1–n are disconnected so that the address of the defective memory cell is stored.

If the selection signals CS1–2 and the address input signals AD11–1n or AD 21–2n coincide with the selection signal of the mask ROM core including the defective memory cell and the address of the defective memory cell respectively, the control signal RAD is driven high, whereas, if not, the control signal RAD is driven low.

An AND gate 1151 inputs the selection signal CS1 and the control signal RAD, and outputs the control signal RS1. When the selection signals CS1–2 and the address input signals AD11–1n coincide with the selection signal CS1 of the mask ROM core 1a including the defective memory cell and the address of the defective memory cell, the control signal RS1 is driven high. The control signal RS1 is transmitted to the switching circuit 12a. When the control signal RS1 is high, the switching circuit 12a switches the output data from the mask ROM core 1a selected by the selection signal CS1 to the output data RD1–m from the data storage circuit 11.

An AND gate 1152 inputs the selection signal CS2 and the control signal RAD, and outputs the control signal RS2. The control signal RS2 is transmitted to the switching circuit 12b. When the selection signal CS2 and the address input signals AD21–2n coincide with the selection signal CS2 of the mask ROM core 1b including the defective memory cell and the address of the defective memory cell respectively, the control signal RS2 is driven high. When the control signal RS2 is high, the switching circuit 12b switches the output data from the mask ROM core 1b selected by the selection signal CS2 to the output data RD1–m from the data storage circuit 11.

The data read operation of the semiconductor device configured as mentioned above will be described. When there is a defective memory cell in the mask ROM core 1 to which the selection signal CS1 is connected, the selection signal and the address of the defective memory cell are stored by disconnecting the fuse FC1 and the corresponding fuses among the fuses FAP1–n and FAN1–n. In addition, the data of the defective memory cell is stored by disconnecting the corresponding fuses among the fuses FD1–m of the data storage circuit 11. When the selection signal and the address input signals AD11–1n coincide with the selection signal CS1 and the address of the defective memory cell, the control signal RAD, RS1 and RS2 output from the address storage circuit 18 are driven high, high, and low, respectively. The switching circuit 12a connected to the output of the mask ROM core 1 selected by the selection signal CS1 selects the output data RD1–m from the data storage circuit 11 and outputs the selected output data. The output data RD1–m from the data storage circuit 11 is transmitted to the next circuit. The switching circuit 12b connected to the output of the mask ROM core 1 selected by the selection signal CS2 selects the output data DATA21–2m from the mask ROM core 1 and outputs the selected output data. The output data DATA21–2m from the mask ROM core 1 is transmitted to the next circuit.

When the address signals AD11–1n don't coincide with the address of the defective memory cell, the control signal RAD, RS1 and RS2 output from the address storage circuit 18 are all driven low. The switching circuit 12a connected to the output of the mask ROM core 1 selected by the selection signal CS1 selects the output data DATA11–1m from the mask ROM core 1 and outputs the selected output data. The output data DATA11–1m from the mask ROM core 1 is transmitted to the next circuit. The switching circuit 12b connected to the output of the mask ROM core 1 selected by the selection signal CS2 outputs the output data DATA21–2m coming from the mask ROM core 1. The output data DATA21–2m from the mask ROM core 1 is transmitted to the next circuit.

According to Embodiment 4, as with Embodiment 1, the semiconductor device which has the configuration where the replacement of the data of the defective memory cell is performed on the output data line of the read only storage device so that the data read time in the case of replacing the defective memory cell is equal to the data read time in the case of reading data from the memory cell array is obtained. Since two mask ROM cores each having a different output data line can share the address storage circuit and the data storage circuit, the increase of chip area is curbed while the replacement of the data of the defective memory cell in two mask ROM cores is permitted.

According to Embodiment 4, the signal from the address storage circuit and the data from the data storage circuit replace the defective memory cell. Instead of this, as with Embodiment 2, the signal from the address storage circuit and the signal from the bit storage circuit may replace the data of the defective memory cell by the bit. As a result, the similar effect to that in Embodiment 2 is obtained.

In addition, according to Embodiment 4, two mask ROM cores each having a separate output data line was described. It is possible to increase the signal CS and apply the present invention to more than two mask ROM cores each having a separate output data line. It is also possible to carry out the invention of Embodiment 3 and the invention of Embodiment 4 in combination. In this case, the effect of curbing the area increase is enhanced.

<<Embodiment 5>>

Figure 12:
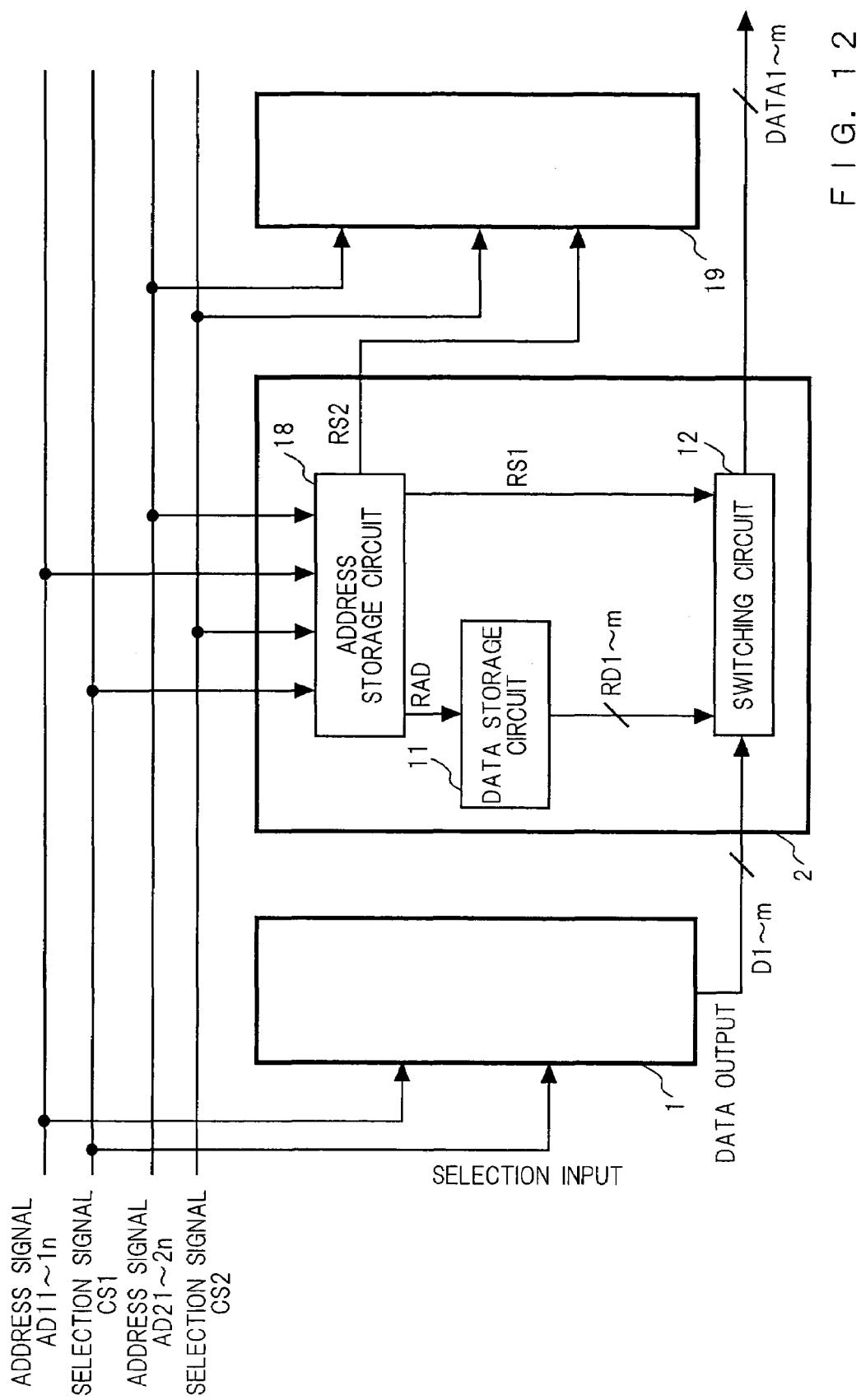
FIG. 12 is a block diagram showing a configuration of a semiconductor device in accordance with Embodiment 5 of the present invention.

FIG. 12 is a circuit diagram showing a configuration of a semiconductor device in accordance with Embodiment 5 of the present invention. The semiconductor device shown in FIG. 12 has the mask ROM core (storage device) 1, the switching device 2 for replacing the data of a defective memory cell, and a rewritable storage device 19 with redundancy memory cells. The switching device 2 has the address storage circuit 18 for storing the address of a memory cell to be replaced (defective memory cell) in the mask ROM core and the address of the defective memory cell to be replaced with the redundancy memory cell in the rewritable storage device 19, the data storage circuit 11 for storing m-bit data which should have been stored in the defective memory cell in the mask ROM core 1, and the switching circuit 12 which inputs the output data D1–m from the mask ROM core 1 and the output data RD1–m from the data storage circuit 11, selects either the output data D1–m or RD1–m according to the output signal RS1 from the address storage circuit 18 and outputs the selected output data. The mask ROM core 1, the data storage circuit 11, and the switching circuit 12 are the same as in Embodiment 1. The address storage circuit 18 is the same as in Embodiment 4. The same numerals are applied to the same components, so that the description thereof is omitted.

The data read operation of the semiconductor device configured as mentioned above will be described. When there is a defective memory cell in the mask ROM core 1 to which the selection signal CS1 connects, by disconnecting the fuse FCS 1 and the corresponding fuses among fuses FAP 1–n and FAN1–n of the address storage circuit 18, the selection signal and the address of the defective memory cell are stored. The data of the defective memory cell is stored by disconnecting the corresponding fuses among the fuses FD1–m of the data storage circuit 11. When the selection signal CS1 is selected and the address input signals AD11–1n coincide with the address of the defective memory cell, the control signals RAD, RS1, and RS2 output from the address storage circuit 18 are driven high, high, and low respectively. The switching circuit 12 connected to the output of the mask ROM core 1 selected by the selection signal CS1 selects the data RD1–m from the data storage circuit 11 and outputs the selected data. The data RD1–m from the data storage circuit 11 is transmitted to the next circuit. On this occasion, the signal (RS2=low level) for not performing the switching to the redundancy memory cell is transmitted to the rewritable storage device 19 to be selected by the selection signal CS2. The rewritable storage device 19 writes data into the memory cell designated by the address or reads data from the memory cell to output the data as usual.

When the address signals AD11–1n and AD21–2n don't coincide with the address of the defective memory cell, the control signals RAD, RS1 and RS2 output from the storage circuit 18 are all driven low. The switching circuit 12 connected to the output of the mask ROM core 1 selected by the signal CS1 outputs the output data D1–m from the mask ROM core 1. The output data D1–m from the mask ROM core 1 is transmitted to the next circuit. On this occasion, the signal for not performing the switching to the redundancy memory cell (RS2=low level) is transmitted to the rewritable storage device 19.

When there is a defective memory cell in the rewritable storage device 19 to which the selection signal CS2 connects, by disconnecting the fuse FCS2 and the corresponding fuses among the fuses FAP1–n and FAN1–n in the address storage circuit 18, the selection signal and the address of the defective memory cell are stored. When the selection signal CS2 is selected and the address input signals AD21–2n coincide with the address of the defective memory cell, the control signals RAD, RS1 and RS2 output from the address storage circuit 18 are high, low, and high, respectively. The rewritable storage device 19 selected by the selection signal CS2 writes input data into the redundancy memory cell instead of the defective memory cell, or reads data and outputs the data therefrom. On this occasion, the control signal RS1 of low level is transmitted to the switching circuit 12.

According to Embodiment 5 described above, as with Embodiment 1, the semiconductor device which has the configuration where the replacement of the data of the defective memory cell is performed on the output data line of the read only storage device so that the data read time in the case of replacing the defective memory cell is equal to the data read time in the case of reading data from the memory cell array is obtained By virtue of the configuration where the address storage circuit and the data storage circuit is shared between the mask ROM core and the rewritable storage device, with the area increase in the semiconductor device curbed, the replacement of the data of the defective memory cell in the mask ROM core and the rewritable storage device is permitted.

According to Embodiment 5, the signal from the address storage circuit and the data from the data storage circuit perform replacement of the defective memory cell. Instead of this, as with Embodiment 2, the signal from the address storage circuit and the signal from the bit storage circuit may replace the data of the defective memory cell by the bit. As a result, the similar effect to that in Embodiment 2 can be obtained.

According to Embodiment 5, the semiconductor device with one mask ROM core and one rewritable storage device was described. It is possible to increase the signal CS and apply the present invention to the semiconductor device having a combination of mask ROM cores and rewritable storage devices, the combined total number of which is at least three. In this case, the effect of curbing the area increase is enhanced.

In Embodiments 1 to 5, the address information of the defective memory to which the redundancy rescue should be applied, and the data of the defective memory cell are stored by fuses, but the information and the data may also be stored in a non-volatile memory.

According to the present invention as described above, the semiconductor device which has the configuration where the replacement of the data of the defective memory cell is performed on the output data line of the read only storage device so that the data read time in the case of replacing the defective memory cell with the address storage circuit and the data storage circuit is equal to the data read time in the case of reading data from the memory cell array can be obtained.

According to the present invention, by storing and decoding the defective bit information in the bit storage circuit, and outputting the information therefrom, the semiconductor device which is still smaller in area is obtained.

The present invention have the specific effect of obtaining the semiconductor device which is small in area and can compensate for the defective memory cell by configuration where a plurality of read only storage circuits and rewritable storage devices share the circuit for the storing storage device selection information and the address information of the defective memory cell and the circuit for storing data thereof.

Although the present invention has been described with respect to its preferred embodiment in some detail, the presently disclosed content of the preferred embodiment may change in the details of the structure thereof and any change in the combination and sequence of the components may be attained without departing from the scope and spirit of the claimed invention.

The invention claimed is:

1. A semiconductor device for outputting data read from a read only storage device, comprising:
a plurality of read only storage devices, each read only storage device including memory cells;
a plurality of selecting signal lines for transmitting selecting signals to the plurality of read only storage devices, each selecting signal line being connected to a corresponding one of the plurality of read storage devices, and each selecting signal indicating one of the plurality of read only storage devices storing data to be read;
an address signal line for transmitting an address signal to the plurality of said read only storage devices, said address signal indicating an address of memory cells storing data to be read; and
a switching device to which the selecting signals and the address signal are inputted, wherein said switching device comprise;
an address storage circuit for storing address information of a defective memory cell of one of the plurality of read only storage devices and for detecting whether or not memory cells storing data selected by a selecting signal and an address signal include a defective memory cell;
a data storage circuit for storing replacement data for memory cells including a defective memory cell, and outputting said replacement data in response to the detection of a defective memory cell by the address storage circuit; and
a switching circuit for inputting data outputted from memory cells of one of the plurality of the read only storage devices which is selected by a selecting signal and an address signal and replacement data outputted from the data storage circuit and outputting data outputted from one of the plurality of the read only storage devices which is not stored in memory cell including a defective memory cell and replacement data from said data storage circuit instead of data outputted from one of the plurality of read only storage devices which is stored in memory cells including a defective memory cell.

2. A semiconductor device for outputting data read from a read only storage device, comprising:
a plurality of read only storage devices, each read only storage device including memory cells;
a plurality of selecting signal lines for transmitting selecting signals to the plurality of read only storage devices, each selecting signal line being connected to a corresponding one of the plurality of read only storage devices, and each selecting signal indicating one of the plurality of read only storage devices storing data to be read;
a plurality of address signal lines for transmitting address signals to the plurality of read only storage devices, each address signal line being connected to a corresponding one of the plurality of read only storage devices, and each address signal indicating an address of memory cells storing data to be read; and
a switching device to which the plurality of selecting signals and the plurality of said address signals are inputted,
wherein said switching device comprises;
an address storage circuit for storing address information of a defective memory cell of one of the plurality of read only storage devices and for detecting whether or not memory cells storing data selected by a selecting signal and an address signal includes a defective memory cell;
a data storage circuit for storing replacement data for memory cells including a defective memory cell and outputting said replacement data in response to the detection of a defective memory cell by said address storage circuit; and
a plurality of switching circuits, each switching circuit inputting data outputted from a corresponding one of the plurality of read only storage devices which is selected by a selecting signal and an address signal and replacement data outputted from said data storage circuit and each switching circuit outputting data from a corresponding one of the plurality of read only storage devices which is not stored in memory cells including a defective memory cell and replacement data from said data storage circuit instead of data outputted from a corresponding one of the plurality of read only storage devices which is stored in memory cells including a defective memory cell.

3. A semiconductor device for outputting data read from a read only storage device, comprising:

a read only storage device including memory cells;

a rewritable storage device including memory cells and redundancy memory cells;

a plurality of selecting signal lines for transmitting selecting signals to said read only storage devices and said rewritable storage devices, each selecting signal line being connected to a corresponding one of said read only storage devices and said rewritable storage devices, each selecting signal indicating one of said read only storage devices and said rewritable storage devices, which stores data to be read;

a plurality of address signal lines for transmitting address signals to said read only storage devices and said rewritable storage devices, each address signal indicating an address of memory cells storing data to be read; and a switching device to which the plurality of selecting signals and the plurality of address signals are inputted, wherein said switching device comprises;

an address storage circuit for storing address information of a defective memory cell of a read only storage device or a rewritable storage device and for detecting whether or not memory cells storing data selected by a selecting signal and an address signal includes a defective memory cell;

a data storage circuit for storing replacement data for memory cells including a defective memory cell and for outputting said replacement data in response to the detection of a defective memory cell by said address storage circuit; and a switching circuit for inputting data outputted from memory cells of a read only storage device which is selected by a selecting signal and an address signal and for inputting replacement data outputted from said data storage circuit and for outputting data outputted from said read only storage device which is not stored in memory cells including a defective memory cell and for outputting replacement data from said data storage circuit instead of data outputted from said read only storage device which is stored in memory cells including a defective memory cell and redundancy memory cells of said rewritable storage device instead of memory cells storing data selected by said selecting signal and said address signal which include a defective memory cell in response to the detection of a defective memory cell by said address storage circuit.

* * * * *

UNITED STATES PATENT AND TRADEMARK OFFICE
CERTIFICATE OF CORRECTION

PATENT NO. : 7,239,563 B2  Page 1 of 1
APPLICATION NO. : 10/728497
DATED : July 3, 2007
INVENTOR(S) : Shuji Nakaya et al.

It is certified that error appears in the above-identified patent and that said Letters Patent is hereby corrected as shown below:

<u>Column 15:</u>

Line 65, after "plurality of read", insert -- only --;

<u>Column 16:</u>

Line 7, "comprise" should read -- comprises --;
Line 25, "cell" should read -- cells --;

<u>Column 17:</u>

Line 2, after "outputting data", insert -- outputted --.

Signed and Sealed this

Twenty-ninth Day of April, 2008

JON W. DUDAS
*Director of the United States Patent and Trademark Office*